United States Patent
Ong et al.

(10) Patent No.: US 8,447,551 B1
(45) Date of Patent: May 21, 2013

(54) HARD DRIVE ASSEMBLY TOOL CALIBRATION VERIFICATION

(75) Inventors: Tze Yang Ong, Petaling Jaya (MY); Jit Han Tan, Petaling Jaya (MY)

(73) Assignee: Western Digital Technologies, Inc., Irvine, CA (US)

( * ) Notice: Subject to any disclaimer, the term of this patent is extended or adjusted under 35 U.S.C. 154(b) by 412 days.

(21) Appl. No.: 12/828,184

(22) Filed: Jun. 30, 2010

(51) Int. Cl.
*G06F 11/30* (2006.01)
*B66F 19/00* (2006.01)
*G01D 21/00* (2006.01)

(52) U.S. Cl.
USPC ............ 702/105; 33/503; 73/1.01; 73/1.79; 73/1.88; 73/865.9; 73/866.3; 340/680; 340/686.6; 702/94; 702/95

(58) Field of Classification Search
USPC .................. 33/501, 503; 73/1.01, 1.79, 1.81, 73/1.88, 865.8, 865.9, 866.3; 340/500, 540, 340/679, 680, 686.1, 686.6; 414/222.01, 414/225.01; 702/1, 85, 88, 94, 95, 105, 127, 702/182, 189; 901/50
IPC . B66F 19/00; G01C 25/00; G01D 18/00,21/00; G06F 11/00, 11/30, 11/32, 17/00, 17/40, G06F 19/00
See application file for complete search history.

(56) References Cited

U.S. PATENT DOCUMENTS

| | | | |
|---|---|---|---|
| 2,435,907 A * | 2/1948 | Sherwood | 340/457.4 |
| 3,334,340 A * | 8/1967 | McConnell | 340/538 |
| 3,434,218 A * | 3/1969 | Potter | 33/503 |
| 3,478,436 A * | 11/1969 | Barnes | 33/503 |
| 3,531,868 A * | 10/1970 | Stevenson | 33/503 |
| 3,605,531 A * | 9/1971 | Hirokawa et al. | 82/11.2 |
| 4,166,543 A * | 9/1979 | Dahlstrom | 700/251 |
| 4,362,977 A * | 12/1982 | Evans et al. | 700/254 |
| 4,382,215 A * | 5/1983 | Barlow et al. | 318/568.1 |
| 4,862,584 A | 9/1989 | Budy et al. | |
| 5,297,238 A | 3/1994 | Wang et al. | |
| 5,566,447 A * | 10/1996 | Sakurai | 29/832 |
| 6,429,999 B1 | 8/2002 | Dague et al. | |
| 6,577,474 B2 | 6/2003 | Kazmierczak et al. | |
| 6,889,424 B2 | 5/2005 | Slife et al. | |
| 2001/0055069 A1 | 12/2001 | Hudson | |
| 2004/0236465 A1 | 11/2004 | Butka et al. | |
| 2009/0062960 A1 | 3/2009 | Krishnasamy et al. | |

FOREIGN PATENT DOCUMENTS

EP    0353585 A2 *   2/1990

* cited by examiner

*Primary Examiner* — Edward Cosimano

(57) ABSTRACT

An assembly tool is provided. The assembly tool comprises a body and a gripper mount slidably mounted to the body with a first actuator. The first actuator is configured to slide the gripper mount from a first position to a second position along an axis. The assembly tool also comprises a gripper assembly slidably mounted to the gripper mount with a second actuator. The second actuator is configured to facilitate displacement of the gripper assembly with respect to the gripper mount along the axis. The assembly tool also comprises an encoder configured to indicate a displacement distance between an expected position and an actual position of the gripper assembly with respect to the gripper mount along the axis when the gripper mount is in the second position.

22 Claims, 7 Drawing Sheets

24

28

HARD DRIVE ASSEMBLY TOOL CALIBRATION VERIFICATION

FIELD

The present invention generally relates to manufacturing and assembly equipment and, in particular, relates to hard drive assembly tool calibration verification.

BACKGROUND

Because of increasing complexity in hard drive components, precision and reliability in hard drive assembly tools are needed. Unfortunately, hard drive assembly tools may break down or become uncalibrated after repeated use, thereby rendering the hard drive assembly tools unfit for their purpose. While operators can manually inspect these assembly tools for wear and tear and other errors, these errors can be overlooked. It is therefore desirable to provide an automated process for verifying the calibration of a hard drive assembly tool.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

DETAILED DESCRIPTION

In the following detailed description, numerous specific details are set forth to provide a full understanding of the subject technology. It will be apparent, however, to one ordinarily skilled in the art that the subject technology may be practiced without some of these specific details. In other instances, well-known structures and techniques have not been shown in detail so as not to obscure the subject technology.

During hard drive assembly processes, assembly tools may use gripper assemblies to pick hard drive components from nests and place the hard drive components onto other hard drive components. For example, a gripper assembly may pick a top voice coil magnet (TVCM) from a TVCM nest and place the TVCM onto a disk drive assembly that is positioned on a disk drive assembly nest. This cycle of picking and placing the TVCM may be repeated numerous times under an automated process. Unfortunately, the assembly tools may break down or become uncalibrated after repeated use. According to various aspects of the subject technology, methods and apparatuses are provided for verifying the calibration of assembly tools.

Figure 1:
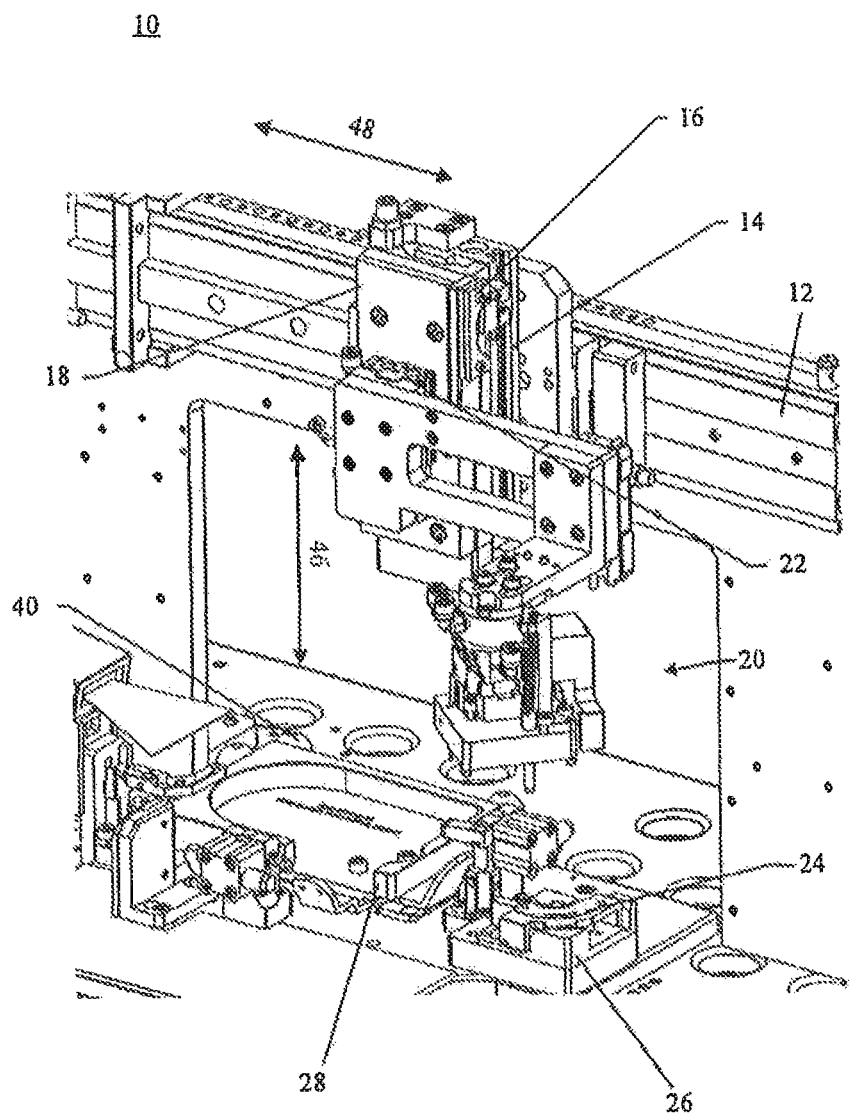
FIG. 1 illustrates a perspective view of an assembly tool in accordance with various aspects of the subject technology.

FIG. 1 illustrates a perspective view of assembly tool 10 in accordance with various aspects of the subject technology. Assembly tool 10 may be used to pick a hard drive component from a nest and place the hard drive component onto another hard drive component or another nest. Aspects of the subject technology provide a method to verify the calibration of assembly tool 10, particularly with respect to the picking and/or placing operation of assembly tool 10. In some aspects, the picking and/or placing operation may be performed using hard drive component gauges to verify the calibration of assembly tool 10. Hard drive component gauges simulate corresponding hard drive components. However, the hard drive component gauges are typically manufactured under stricter tolerance requirements than the corresponding hard drive components. Thus, if calibration of assembly tool 10 is determined to be needed for the picking and/or placing operation using the hard drive component gauges, then calibration of assembly tool 10 may also be needed in the picking and/or placing operation using the corresponding hard drive components. Therefore, if assembly tool 10 is calibrated according to the picking and/or placing operation performed using the hard drive component gauges, then assembly tool 10 may also be calibrated with respect to the picking and/or placing operation using the corresponding hard drive components. However, the subject technology is not limited to using hard drive component gauges to verify the calibration of assembly tool 10. In some aspects, the actual hard drive components may also be used.

According to certain aspects, examples of hard drive component gauges that may be used in the picking and/or placing operation are top voice coil magnet (TVCM) gauge 24 and nest gauge 28. However, other suitable hard drive components and/or suitable hard drive component gauges also may be used, including, for example and without limitation, a head stack, a head stack gauge, a top cover of a hard drive, a hard drive component gauge simulating the top cover, a pivot shaft, a hard drive component gauge simulating the pivot shaft, a TVCM presenter nest, a hard drive nest gauge simulating the TVCM presenter nest, a breather filter install nest, or a hard drive nest gauge simulating the breather filter install nest.

According to various aspects of the subject technology, assembly tool 10 may be used to pick TVCM gauge 24 from first nest 26 and place TVCM gauge 24 onto nest gauge 28 on second nest 40. In some aspects, calibration of assembly tool 10 may be verified, particularly with respect to the picking and/or placing operation of assembly tool 10.

Assembly tool 10 comprises body 12 and gripper mount 18 slidably mounted to body 12 with first actuator 14. First actuator 14 is configured to slide gripper mount 18 from a first position to a second position along axis 46. Assembly tool 10 also comprises gripper assembly 20 slidably mounted to gripper mount 18 with second actuator 22. Second actuator 22 is configured to facilitate displacement of gripper assembly 20 with respect to gripper mount 18 along axis 46. Assembly tool 10 also comprises encoder 16 configured to measure an amount of displacement between gripper assembly 20 and gripper mount 18.

Gripper assembly 20 is configured to grip TVCM gauge 24 for picking TVCM gauge 24 from first nest 26 and for placing TVCM gauge 24 onto nest gauge 28 on second nest 40. In some aspects, gripper assembly 20 may utilize mechanical fingers to grip TVCM gauge 24. In picking TVCM gauge 24, gripper mount 18 may be slid along body 12 (e.g., along axis 48 toward the right as described relative to FIG. 1) such that gripper assembly 20 is elevated above TVCM gauge 24 on first nest 26. This position of gripper mount 18 and gripper assembly 20 may be referred to as an initial pick position. First actuator 14, which may be a pneumatic actuator, may slide gripper mount 18, together with gripper assembly 20, from the initial pick position along axis 46 in a downward direction (as described relative to FIG. 1) to a final pick position. In some aspects, the final pick position of gripper mount 18 and gripper assembly 20 may be an ideal pick position where gripper assembly 20 initially engages and grips TVCM gauge 24 on first nest 26.

In some aspects, the final pick position of gripper mount 18 and/or gripper assembly 20 may be beyond the ideal pick position. For example in one scenario, first actuator 14 may continue to slide gripper mount 18 in the downward direction even though gripper assembly 20 has already engaged TVCM gauge 24 on first nest 26, causing gripper mount 18 to overshoot the ideal pick position. In another scenario, gripper assembly 20 may be out of position with respect to gripper mount 18, causing gripper assembly 20 to engage TVCM gauge 24 too soon while gripper mount 18 is still moving toward its final pick position. In some aspects, both scenarios may occur, causing gripper mount 18 and/or gripper assembly 20 to be positioned beyond the ideal pick position.

According to various aspects of the subject technology, second actuator 22 may facilitate displacement of gripper assembly 20 with respect to gripper mount 18 when gripper mount 18 and/or gripper assembly 20 is positioned beyond the ideal pick position. For example, second actuator 22 may allow gripper assembly 20 to slide along axis 46 in an upward direction with respect to gripper mount 18 while gripper mount 18 is slid in the downward direction beyond the ideal pick position. Thus, gripper assembly 20 may remain at a position where it is engaged to TVCM gauge 24 even if first actuator 14 continues to slide gripper mount 18 in the downward direction to a final pick position that is beyond the ideal pick position.

In some aspects, second actuator 22 may be a pneumatic actuator operated in a passive mode. For example, second actuator 22 may be an offload pneumatic actuator that does not actively slide gripper assembly 20 with respect to gripper mount 18, but rather allows gripper assembly 20 to slide with respect to gripper mount 18 once an external force is exerted on gripper assembly 20. In the foregoing example of picking TVCM gauge 24, if gripper mount 18 slides in the downward direction beyond the ideal pick position, an upward force is exerted on gripper assembly 20 from TVCM gauge 24 such that gripper assembly 20 slides in the upward direction along axis 46 with respect to gripper mount 18. Second actuator 22 allows for such a displacement between gripper assembly 20 and gripper mount 18 to occur. In some aspects, second actuator 22 also causes gripper assembly 20 to return to its initial position once the external force is removed.

After gripper assembly 20 has gripped TVCM gauge 24, first actuator 14 may slide gripper mount 18, together with gripper assembly 20 and the gripped TVCM gauge 24, along axis 46 in the upward direction back to the initial pick position. Gripper mount 18 may then be slid along body 12 (e.g., along axis 48 toward the left as described relative to FIG. 1) to an initial place position such that gripper assembly 20 and the gripped TVCM gauge 24 are elevated above nest gauge 28 for placing TVCM gauge 24 onto nest gauge 28 on second nest 40.

In placing TVCM gauge 24, gripper mount 18 and gripper assembly 20 may be operated in a manner similar to picking TVCM gauge 24. For example, first actuator 14 may slide gripper mount 18, together with gripper assembly 20 and the gripped TVCM gauge 24, from the initial place position along axis 46 in the downward direction to a final place position. In some aspects, the final place position of gripper mount 18, together with gripper assembly 20 and the gripped TVCM gauge 24, may be an ideal place position where the gripped TVCM gauge 24 initially engages nest gauge 28 for its placement onto nest gauge 28 on second nest 40.

In some aspects, the final place position of gripper mount 18 and/or gripper assembly 20 may be beyond the ideal place position. For example in one scenario, first actuator 14 may continue to slide gripper mount 18 in the downward direction even though TVCM gauge 24 has already engaged nest gauge 28 on second nest 40, causing gripper mount 18 to overshoot the ideal place position. In another scenario, gripper assembly 20 may be out of position with respect to gripper mount 18, causing the gripped TVCM gauge 24 to engage nest gauge 28 too soon while gripper mount 18 is still moving toward its final place position. In some aspects, both scenarios may occur, causing gripper mount 18 and/or gripper assembly 20 to be positioned beyond the ideal place position.

According to various aspects of the subject technology, second actuator 22 may be used to facilitate displacement of gripper assembly 20 with respect to gripper mount 18 when gripper mount 18 and/or gripper assembly 20 is positioned beyond the ideal place position. For example, second actuator 22 may allow gripper assembly 20 to slide along axis 46 in the upward direction with respect to gripper mount 18 while gripper mount 18 is slid in the downward direction beyond the ideal place position. Thus, gripper assembly 20 may remain at a position where the gripped TVCM gauge 24 is engaged to nest gauge 28 even if first actuator 14 continues to slide gripper mount 18 in the downward direction to a final place position that is beyond the ideal place position.

Figure 2:
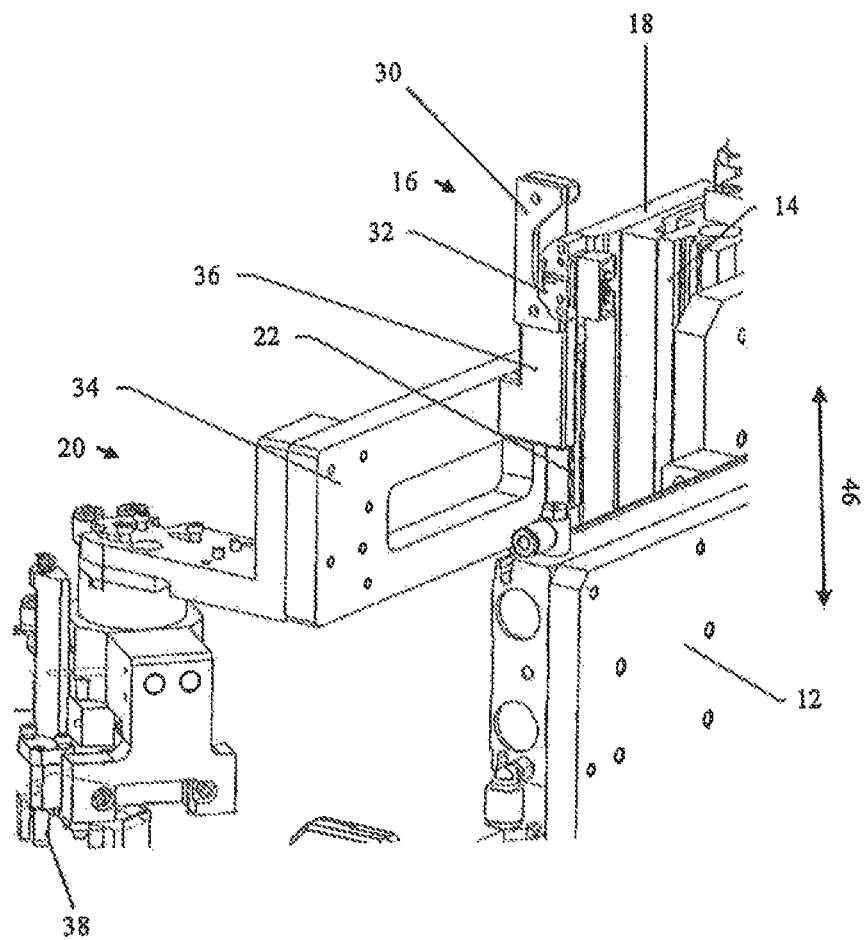
FIG. 2 illustrates a perspective view of the assembly tool from behind the perspective view of FIG. 1, in accordance with various aspects of the subject technology.

FIG. 2 illustrates a perspective view of assembly tool 10 from behind the perspective view of FIG. 1, in accordance with various aspects of the subject technology. Gripper assembly 20 comprises gripper head 38 configured to grip TVCM gauge 24. In some aspects, gripper head 38 may utilize mechanical fingers to grip TVCM gauge 24. Gripper assembly 20 also comprises gripper bracket 34 configured to couple gripper head 38 to second actuator 22. Gripper assembly 20 also comprises extension bracket 36 configured to couple gripper bracket 34 to encoder 16. In some aspects, encoder 16 comprises scale 30 coupled to extension bracket 36. Encoder 16 also comprises reader 32 coupled to gripper mount 18. In some aspects, scale 30 may be coupled to gripper mount 18 while reader 32 may be coupled to extension bracket 36.

According to various aspects of the subject technology, encoder 16 is configured to indicate a displacement distance of gripper assembly 20 with respect to gripper mount 18. In some aspects, encoder 16 is configured to indicate the displacement distance by measuring a position of reader 32 relative to scale 30 when gripper assembly 20 is displaced relative to gripper mount 18. For example, in picking TVCM gauge 24, first actuator 14 may slide gripper mount 18 along axis 46 in the downward direction until gripper head 38 engages TVCM gauge 24. If first actuator 14 continues to slide gripper mount 18 (including reader 32) in the downward direction beyond the ideal pick position, second actuator 22 may allow gripper assembly 20 (including gripper head 38, gripper bracket 34, extension bracket 36, and scale 30) to slide along axis 46 in the upward direction with respect to gripper mount 18. In this regard, reader 32 is displaced relative to scale 30, thereby allowing encoder 16 to measure the displacement distance of gripper assembly 20 with respect to gripper mount 18 by measuring the position of reader 32 with respect to scale 30.

According to various aspects of the subject technology, calibration of assembly tool 10 may be verified, particularly with respect to the picking and/or placing operation of assembly tool 10. For example, it may be determined whether assembly tool 10 is in need of calibration with respect to its picking and/or placing operation. In some aspects, such a determination is based on the displacement distance measured by encoder 16. For example, in an ideal picking or placing operation, the displacement distance between gripper mount 18 and gripper assembly 20 is zero. That is, first actuator 14 slides gripper mount 18 to the ideal pick position or the ideal place position, and gripper assembly 20 is not displaced with respect to gripper mount 18. Displacement between gripper mount 18 and gripper assembly 20, on the other hand, may indicate that gripper assembly 20 is not being positioned ideally.

According to certain aspects, second actuator 22 provides a range of tolerance for gripper mount 18 to slide beyond the ideal pick position or the ideal place position such that gripper assembly 20 is displaced with respect to gripper mount 18 and still allow gripper assembly 20 to pick and/or place TVCM gauge 24. In some aspects, an operator of assembly tool 10 may specify a predetermined displacement tolerance (e.g., a predetermined pick tolerance range or a predetermined place tolerance range) that gripper assembly 20 may be displaced with respect to gripper mount 18 before it is determined that calibration of assembly tool 10 is needed. Thus, if the displacement distance between gripper mount 18 and gripper assembly 20 exceeds the predetermined displacement tolerance, then it may be determined that calibration of assembly tool 10 is needed.

Figure 3A:
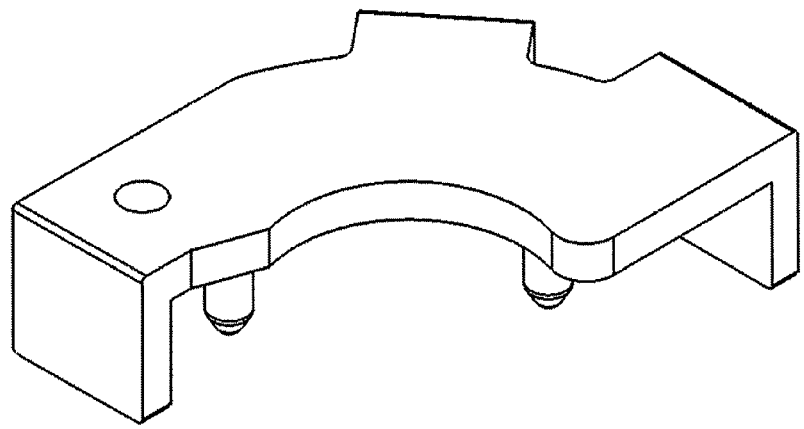
FIGS. 3A and 3B illustrate examples of a first hard drive component and a second hard drive component in accordance with various aspects of the subject technology.
Figure 3B:
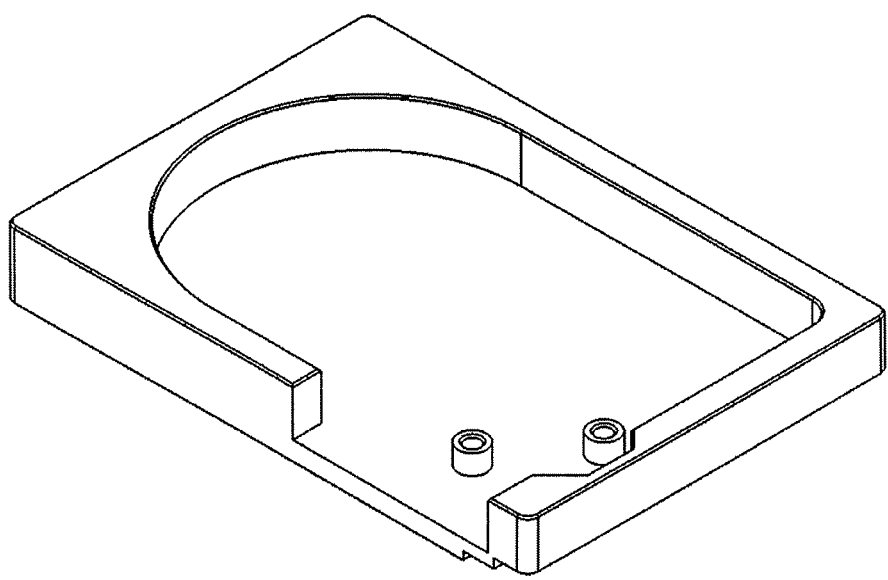

FIGS. 3A and 3B illustrate perspective views of TVCM gauge 24 and nest gauge 28 in accordance with various aspects of the subject technology. As shown in FIGS. 3A and 3B, TVCM gauge 24 is a hard drive component gauge simulating a TVCM and nest gauge 28 is a hard drive nest gauge simulating a disk drive assembly. As noted above, it may be beneficial to use a hard drive component gauge, rather than the hard drive component it is simulating, for verifying the calibration of assembly tool 10. This is because the hard drive component gauge is typically manufactured under stricter tolerance requirements than the hard drive component it is simulating, and the calibration of assembly tool 10 according to the hard drive component gauge may ensure that assembly 10 is also calibrated with respect to the corresponding hard drive component.

For example, TVCM gauge 24 may comprise dimensions having a tolerance control that is 50% less than a tolerance control of dimensions of the TVCM. Similarly, nest gauge 28 may comprise dimensions having a tolerance control that is 50% less than a tolerance control of dimensions of the disk drive assembly. Thus, TVCM gauge 24 is more likely to be closer to ideal dimensions than an average TVCM produced under a more lenient tolerance control. Similarly, nest gauge 28 is more likely to be closer to ideal dimensions than an average disk drive assembly produced under a more lenient tolerance control. In some aspects, hard drive component gauges having stricter or more lenient tolerance controls may be used depending on the amount of accuracy desired.

In some aspects, if calibration of assembly tool 10 is determined to be needed for the picking and/or placing operation using TVCM gauge 24, then calibration of assembly tool 10 may also be needed in the picking and/or placing operation using the TVCM. Similarly, if calibration of assembly tool 10 is determined to be needed for the picking and/or placing operation using nest gauge 28, then calibration of assembly tool 10 may also be needed in the picking and/or placing operation using the disk drive assembly. Therefore, if assembly tool 10 is calibrated according to the picking and/or placing operation performed using TVCM gauge 24 and nest gauge 28, then assembly tool 10 may also be calibrated with respect to the picking and/or placing operation using the TVCM and the disk drive assembly.

Figure 4:
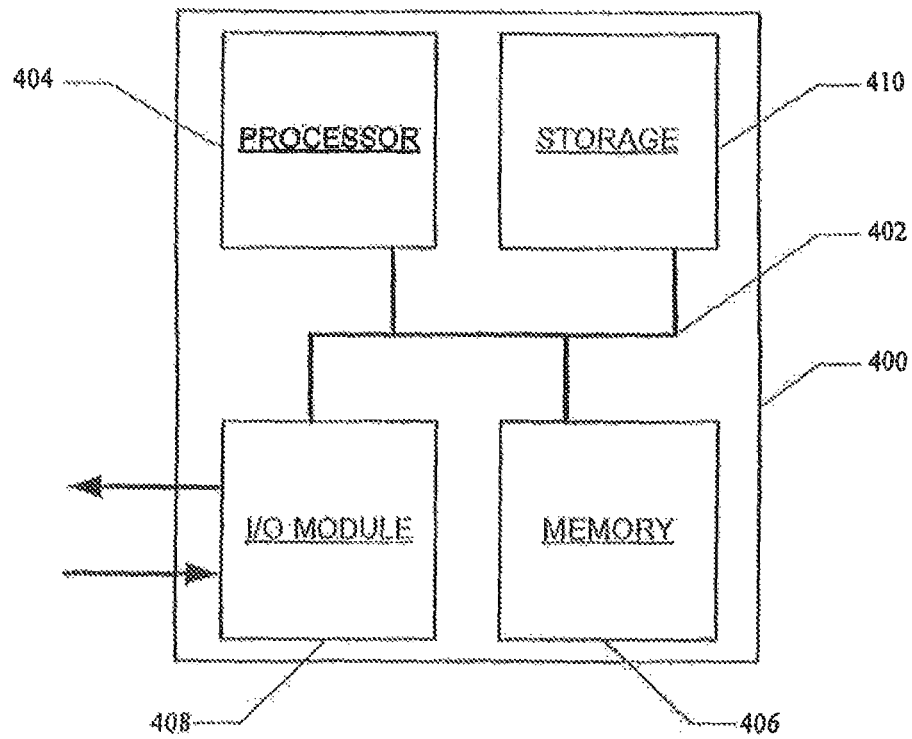
FIG. 4 is a block diagram illustrating components of a controller in accordance with various aspects of the subject technology.

FIG. 4 is a block diagram illustrating components of controller 400 in accordance with various aspects of the subject technology. In some aspects, assembly tool 10 further comprises controller 400. In some aspects, the operation of assembly tool 10 is controlled by one or more programs stored in or entered into controller 400, for example. Thus, an operator of assembly tool 10 may control its operation by selecting, modifying, and/or creating programs stored in controller 400.

According to various aspects of the subject technology, controller 400 is coupled to encoder 16 and configured to compare the displacement distance between gripper mount 18 and gripper assembly 20 with the predetermined displacement tolerance (e.g., either the predetermined pick tolerance range or the predetermined place tolerance range) and to generate a calibration signal based on the comparison. In some aspects, controller 400 is configured to generate the calibration signal if the displacement distance is not within the predetermined displacement tolerance. The calibration signal, for example, may inform an operator of assembly tool 10 that calibration of assembly tool 10 is warranted and/or that an error has occurred in the operation of assembly tool 10.

Controller 400 comprises processor module 404, storage module 410, input/output (I/O) module 408, memory module 406, and bus 402. Bus 402 may be any suitable communication mechanism for communicating information. Processor module 404, storage module 410, I/O module 408, and memory module 406 are coupled with bus 402 for communicating information between any of the modules of controller 400 and/or information between any module of controller 400 and a device external to controller 400. For example, information communicated between any of the modules of controller 400 may include instructions and/or data. In some aspects, bus 402 may be a universal serial bus. In some aspects, bus 402 may provide Ethernet connectivity.

In some aspects, processor module 404 may comprise one or more processors, where each processor may perform different functions or execute different instructions and/or processes. For example, one or more processors may execute instructions for operating assembly tool 10, one or more processors may execute instructions for verifying the calibration of assembly tool 10, and one or more processors may execute instructions for input/output functions.

Memory module 406 may be random access memory ("RAM") or other dynamic storage devices for storing information and instructions to be executed by processor module 404. Memory module 406 may also be used for storing temporary variables or other intermediate information during execution of instructions by processor 404. In some aspects, memory module 406 may comprise battery-powered static RAM, which stores information without requiring power to maintain the stored information. Storage module 410 may be a magnetic disk or optical disk and may also store information and instructions. In some aspects, storage module 410 may comprise hard disk storage or electronic memory storage (e.g., flash memory). In some aspects, memory module 406 and storage module 410 are both a machine-readable medium.

In some aspects, controller 400 is coupled via I/O module 408 to a suitable user interface for providing information to and receiving information from an operator of assembly tool 10. For example, the user interface may be a cathode ray tube ("CRT") or liquid crystal display ("LCD") monitor for displaying information to an operator. The user interface may also include, for example, a keyboard or a mouse coupled to controller 400 via I/O module 408 for communicating information and command selections to processor module 404. In some aspects, the operator of assembly tool 10 may be informed via I/O module 408 whether calibration of assembly tool 10 is warranted. For example, this information may be displayed on the LCD monitor.

According to various aspects of the subject technology, methods described herein are executed by controller 400. Specifically, processor module 404 executes one or more sequences of instructions contained in memory module 406 and/or storage module 410. In one example, instructions may be read into memory module 406 from another machine readable medium, such as storage module 410. In another example, instructions may be read directly into memory module 406 from I/O module 408, for example from an operator of assembly tool 10 via the user interface. Execution of the sequences of instructions contained in memory module 406 and/or storage module 410 causes processor module 404 to perform methods to determine whether calibration is warranted during a picking and/or placing operation of assembly tool 10. For example, a computational algorithm for verifying the calibration of assembly tool 10, may be stored in memory module 406 and/or storage module 410 as one or more sequences of instructions. Information such as the displacement distance between gripper mount 18 and gripper assembly 20, and/or the predetermined displacement tolerance may be communicated from processor module 404 to memory module 406 and/or storage module 410 via bus 402 for storage. In some aspects, the information may be communicated from processor module 404, memory module 406, and/or storage module 410 to I/O module 408 via bus 402. The information may then be communicated from I/O module 408 to an operator of assembly tool 10 via the user interface.

One or more processors in a multi-processing arrangement may also be employed to execute the sequences of instructions contained in memory module 406 and/or storage module 410. In some aspects, hard-wired circuitry may be used in place of or in combination with software instructions to implement various aspects of the subject technology. Thus, aspects of the subject technology are not limited to any specific combination of hardware circuitry and software.

The term "machine-readable medium," or "computer-readable medium," as used herein, refers to any medium that participates in providing instructions to processor module 404 for execution. Such a medium may take many forms, including, but not limited to, non-volatile media, and volatile media. Non-volatile media include, for example, optical or magnetic disks, such as storage module 410. Volatile media include dynamic memory, such as memory module 406. Common forms of machine-readable media or computer-readable media include, for example, floppy disk, a flexible disk, hard disk, magnetic tape, any other magnetic medium, a CD-ROM, DVD, any other optical medium, punch cards, paper tape, any other physical mediums with patterns of holes, a RAM, a PROM, an EPROM, a FLASH EPROM, any other memory chip or cartridge, or any other medium from which a processor can read.

Although controller 400 is illustrated as comprising processor module 404, storage module 410, memory module 406, I/O module 408, and bus 402, other suitable arrangements (e.g., having more or less modules) known to those of ordinary skill in the art may be used. For example, controller 400 may be a logic implemented state machine or a programmable logic controller.

Figure 5:
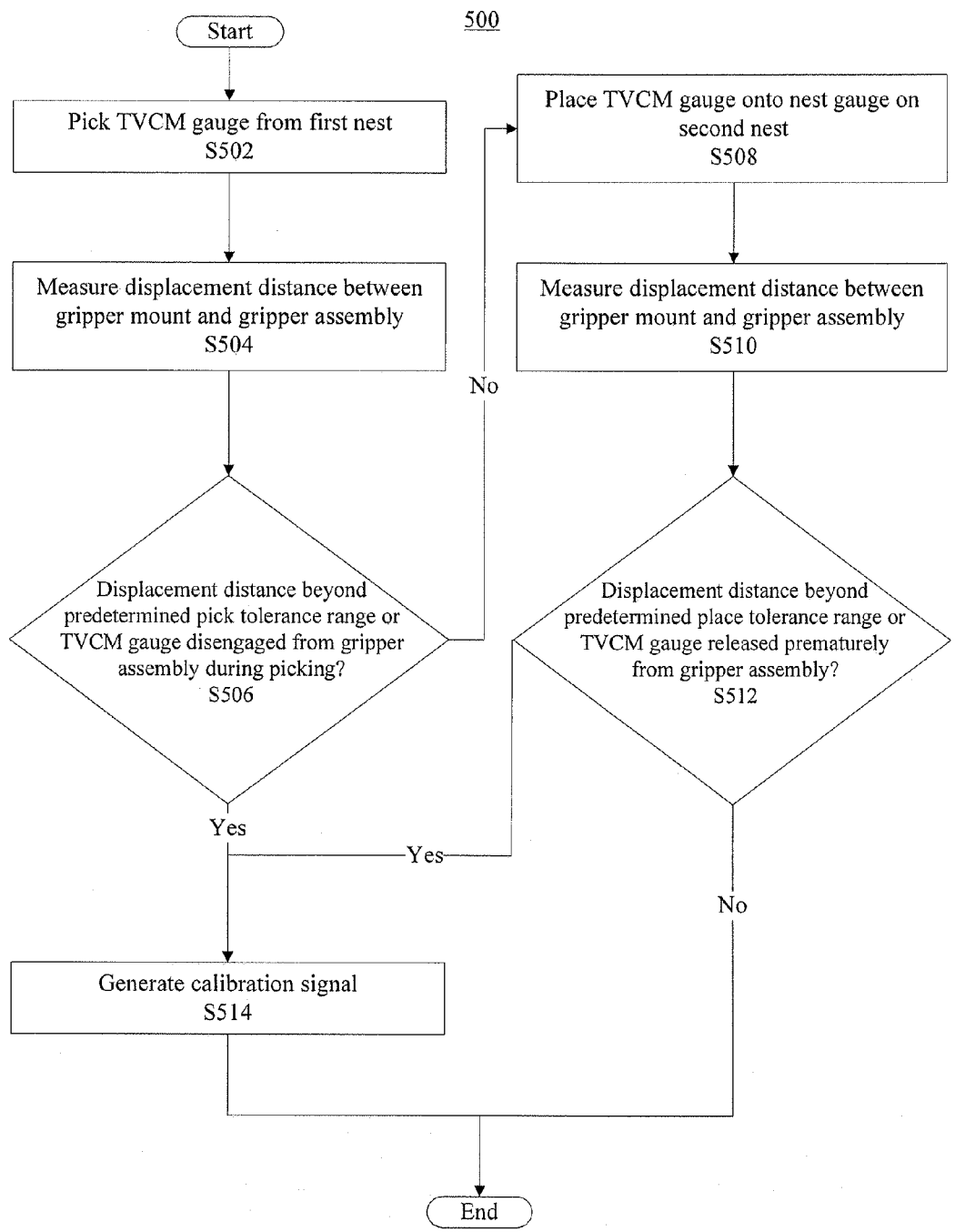
FIG. 5 illustrates a method for verifying an operation of an assembly tool in accordance with various aspects of the subject technology.

FIG. 5 illustrates method 500 for verifying the calibration of assembly tool 10 in accordance with various aspects of the subject technology. Method 500, for example, may be implemented by an operator of assembly tool 10 for determining whether calibration of assembly tool 10 is warranted, particularly with respect to the picking and/or placing operation of TVCM gauge 24. One or more sequences of instructions used to perform method 500 may be stored in memory module 406 and/or storage module 410. Processor module 404 may execute these sequences of instructions to determine whether calibration of assembly tool 10 is warranted.

In some aspects, the operator of assembly 10 may execute method 500 as a daily routine to verify the calibration of assembly tool 10. In an initialization process at the "Start" of method 500 before step S502 is executed, TVCM gauge 24 may be placed on first nest 26 and nest gauge 28 may be placed on second nest 40. During the initialization process, an operator may also initialize a reading of encoder 16 to a default value (e.g., zero displacement distance) as well as specify a predetermined displacement tolerance (e.g., a predetermined pick tolerance range and a predetermined place tolerance range). In some aspects, these values may be stored in memory module 406 and/or storage module 410. In some aspects, during the initialization process, gripper mount 18 may be positioned at the initial pick position such that gripper assembly 20 is elevated above TVCM gauge 24 on first nest 26.

Figure 6A:
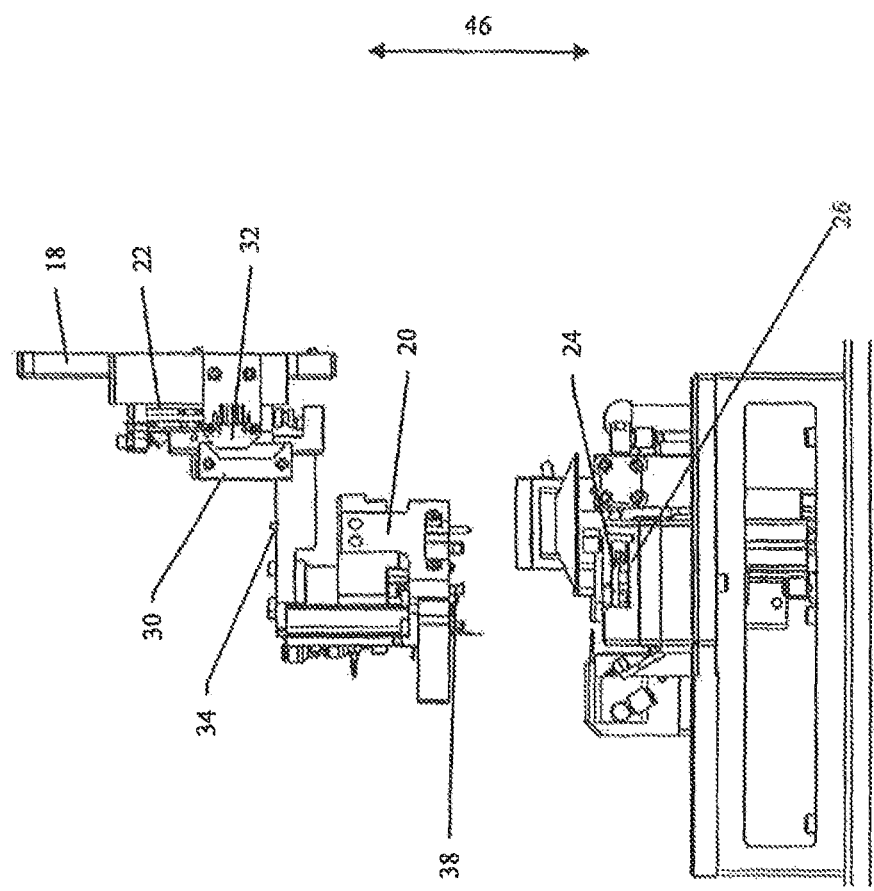
FIGS. 6A and 6B illustrate a gripper mount, together with a gripper assembly, in various pick positions in accordance with various aspects of the subject technology.

FIG. 6A illustrates gripper mount 18, together with gripper assembly 20, in the initial pick position. A reading of encoder 16 is at a default value indicating zero displacement between gripper mount 18 and gripper assembly 20. In particular, reader 32 is positioned relative to scale 30 at an initial read position. As shown in FIG. 6A, reader 32 is initially positioned near an upper portion of scale 30. The initial read position of reader 32 may also indicate an expected position of gripper assembly 20 with respect to gripper mount 18. That is, the expected position of gripper assembly 20 with respect to gripper mount 18 is a position in which gripper assembly 20 has engaged and gripped TVCM gauge 24 without being displaced with respect to gripper mount 18.

Referring to step S502, gripper assembly 20 may be used to pick TVCM gauge 24 from first nest 26. First actuator 14 may slide gripper mount 18, together with gripper assembly 20, from the initial pick position along axis 46 in the downward direction (as described relative to FIG. 6A) to the final pick position. As noted above, the final pick position of gripper mount 18 and gripper assembly 20 may be an ideal pick position where gripper assembly 20 initially engages and grips TVCM gauge 24 on first nest 26. However, the final pick position of gripper mount 18 and/or gripper assembly 20 may be beyond the ideal pick position. For example, first actuator 14 may continue to slide gripper mount 18 in the downward direction even though gripper assembly 20 has already engaged TVCM gauge 24 on first nest 26, causing gripper mount 18 to overshoot the ideal pick position. In another example, gripper assembly 20 may be out of position with respect to gripper mount 18, causing gripper assembly 20 to engage TVCM gauge 24 too soon while gripper mount 18 is still moving toward its final pick position.

Figure 6B:
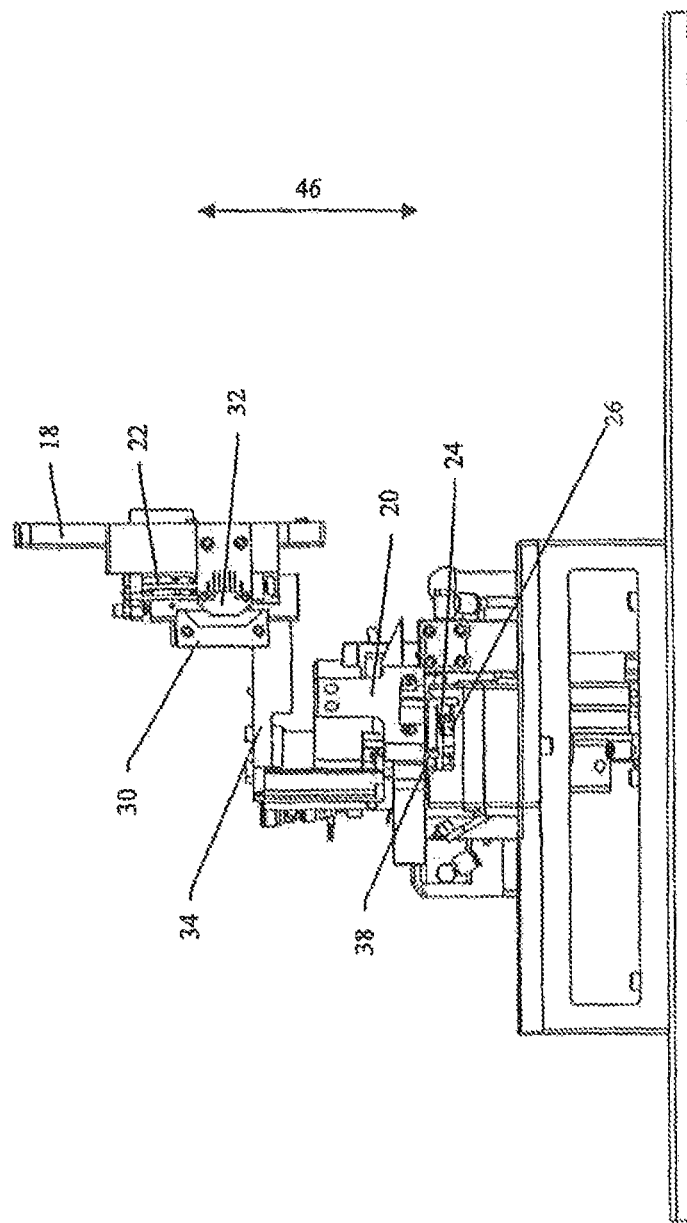

According to various aspects of the subject technology, second actuator 22 may facilitate displacement of gripper assembly 20 with respect to gripper mount 18 when gripper mount 18 and/or gripper assembly 20 is positioned beyond the ideal pick position. For example, second actuator 22 may allow gripper assembly 20 to slide along axis 46 in an upward direction with respect to gripper mount 18 while gripper mount 18 is slid in the downward direction beyond the ideal pick position. Thus, gripper assembly 20 may remain at a position where it is engaged to TVCM gauge 24 even if first actuator 14 continues to slide gripper mount 18 in the downward direction to a final pick position that is beyond the ideal pick position. FIG. 6B illustrates gripper mount 18, together with gripper assembly 20, in the final pick position.

Referring to step S504, encoder 16 measures a pick displacement distance between gripper mount 18 and gripper assembly 20. Encoder 16 may measure the position of reader 32 relative to scale 30 when gripper assembly 20 is displaced relative to gripper mount 18. As shown in FIG. 6B, reader 32 is positioned near a middle portion of scale 30, which indicates an actual position that gripper assembly 20 is displaced relative to gripper mount 18 when gripper mount 18 is slid to the final pick position. The difference between the expected position and the actual position of gripper assembly 20 indicates the pick displacement distance between gripper mount 18 and gripper assembly 20.

Referring to step S506, the pick displacement distance is compared to a predetermined pick tolerance range. In some aspects, the pick displacement distance is stored in storage module 410 and/or memory module 406. Controller 400 may compare the pick displacement distance with the predetermined pick tolerance range. If the pick displacement distance is beyond the predetermined pick tolerance range, then it is determined that assembly tool 10 is in need of calibration with respect to the picking operation, and a calibration signal is generated, according to step S514. The calibration signal may indicate to an operator of assembly tool 10 that calibration of assembly tool 10 is warranted with respect to the picking operation.

According to some aspects, gripper assembly 20 may comprise fiber optic sensors, which may also be used to verify the calibration of assembly tool 10. For example, gripper assembly 20 may utilize mechanical fingers to grip TVCM gauge 24. The fiber optic sensors may be able to detect the presence of TVCM gauge 24 when gripper assembly 20 is gripping TVCM gauge 24. According to certain aspects, a reading of the fiber optic sensors within a threshold range may indicate that TVCM gauge 24 is gripped by gripper assembly 20, while a reading of the fiber optic sensors beyond the threshold range may indicate that TVCM gauge 24 is disengaged from gripper assembly 20. Thus, if the fiber optic sensors detect a reading beyond the threshold range during the picking operation, then TVCM gauge 24 is disengaged from gripper assembly 20. For example, TVCM gauge 24 may have fallen off from gripper assembly 20. In some aspects, the threshold range may be set at an appropriate range by an operator of assembly tool 10. According to steps S506 and S514, if TVCM gauge 24 is disengaged from gripper assembly 20 during the picking, the calibration signal is generated.

If the pick displacement distance is within the predetermined pick tolerance range and TVCM gauge 24 has not been released from gripper assembly 20 during the picking, then the picking of TVCM gauge 24 is deemed to be suitable, and that calibration of assembly tool 10 with respect to the picking operation is not necessary. After the suitable picking operation, first actuator 14 may slide gripper mount 18, together with gripper assembly 20 and the gripped TVCM gauge 24, in the upward direction along axis 46, for example, back to the initial pick position. Gripper mount 18, together with gripper assembly 20 and the gripped TVCM gauge 24, may then be slid along axis 48 (e.g., as shown in FIG. 1) to the initial place position such that gripper assembly 20 and the gripped TVCM gauge 24 are elevated above nest gauge 28 on second nest 40. From this position, TVCM gauge 24 may be placed on nest gauge 28 on second nest 40, according to step S508. Gripper mount 18 and gripper assembly 20 may be operated in a manner similar to picking TVCM gauge 24 as discussed with respect to steps S502, S506, S508, and S514. For example, first actuator 14 may slide gripper mount 18, together with gripper assembly 20 and the gripped TVCM gauge 24, from the initial place position along axis 46 in the downward direction to the final place position. As noted above, the final place position of gripper mount 18, together with gripper assembly 20 and the gripped TVCM gauge 24, may be an ideal place position where the gripped TVCM gauge 24 initially engages nest gauge 28 for its placement onto nest gauge 28 on second nest 40.

However, the final place position of gripper mount 18 and/or gripper assembly 20 may be beyond the ideal place position. For example, first actuator 14 may continue to slide gripper mount 18 in the downward direction even though TVCM gauge 24 has already engaged nest gauge 28 on second nest 40, causing gripper mount 18 to overshoot the ideal place position. In another example, gripper assembly 20 may be out of position with respect to gripper mount 18, causing the gripped TVCM gauge 24 to engage nest gauge 28 too soon while gripper mount 18 is still moving toward its final place position.

According to various aspects of the subject technology, second actuator 22 may be used to facilitate displacement of gripper assembly 20 with respect to gripper mount 18 when gripper mount 18 and/or gripper assembly 20 is positioned beyond the ideal place position. For example, second actuator 22 may allow gripper assembly 20 to slide along axis 46 in the upward direction with respect to gripper mount 18 while gripper mount 18 is slid in the downward direction beyond the ideal place position. Thus, gripper assembly 20 may remain at a position where the gripped TVCM gauge 24 is engaged to nest gauge 28 even if first actuator 14 continues to slide gripper mount 18 in the downward direction to a final place position that is beyond the ideal place position.

Referring to step S510, encoder 16 measures a place displacement distance between gripper mount 18 and gripper assembly 20. Encoder 16 may measure the position of reader 32 relative to scale 30 when gripper assembly 20 is displaced relative to gripper mount 18. In some aspects, second actuator 22 causes gripper assembly 20, and consequently reader 32, to return to its initial position once the external force exerted from TVCM gauge 24 is removed after picking TVCM gauge 24. Thus, reader 32 may be positioned near the upper portion of scale 30, as shown in FIG. 6A, before TVCM gauge 24 is engaged to nest gauge 28. In some aspects, reader 32 may still be at the same position it was in at the conclusion of the picking operation (e.g., positioned near the middle portion of scale 30 as shown in FIG. 6B). In some aspects, the place displacement distance may be measured by measuring a distance that reader 32 is displaced starting from its position at the conclusion of the picking operation to when gripper mount 18 is slid into the final place position. This distance indicates the place displacement distance between gripper mount 18 and gripper assembly 20.

Referring to step S512, the place displacement distance is compared to a predetermined place tolerance range. In some aspects, the place displacement distance is stored in storage module 410 and/or memory module 406. Controller 400 may compare the place displacement distance with the predetermined place tolerance range. If the place displacement distance is beyond the predetermined place tolerance range, then it is determined that assembly tool 10 is in need of calibration with respect to the placing operation, and a calibration signal is generated, according to step S514. The calibration signal may indicate to an operator of assembly tool 10 that calibration of assembly tool 10 is warranted with respect to the placing operation.

According to certain aspects, the fiber optic sensors of gripper assembly 20 may be used to verify the calibration of assembly tool 10. For example, a reading of the fiber optic sensors beyond the threshold range may indicate that TVCM gauge 24 is disengaged from gripper assembly 20. Thus, if the fiber optic sensors detect a reading beyond the threshold range during the placing operation (e.g., while gripper mount 18 is moving in the downward direction), then TVCM gauge 24 has been released prematurely from gripper assembly 20. For example, TVCM gauge 24 may have fallen off from gripper assembly 20. According to steps S512 and S514, if TVCM gauge 24 is released prematurely from gripper assembly 20 during the placing, the calibration signal is generated.

If the place displacement distance is within the predetermined place tolerance range and TVCM gauge 24 has not been released prematurely from gripper assembly 20 during the placing, then the placing of TVCM gauge 24 is deemed to be suitable, and that calibration of assembly tool 10 with respect to the placing operation is not necessary. Accordingly, by performing method 500, calibration of assembly tool 10 may be verified, particularly with respect to the picking and/or placing operation of assembly tool 10.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. An assembly tool comprising:
    a body;
    a gripper mount slidably mounted to the body with a first actuator, wherein the first actuator is configured to slide the gripper mount from a first position to a second position along an axis;
    a gripper assembly slidably mounted to the gripper mount with a second actuator, wherein the second actuator is configured to facilitate displacement of the gripper assembly with respect to the gripper mount along the axis; and
    an encoder configured to indicate a displacement distance between an expected position and an actual position of the gripper assembly with respect to the gripper mount along the axis when the gripper mount is in the second position.

2. The assembly tool of claim 1, wherein the first actuator is a pneumatic actuator.

3. The assembly tool of claim 1, wherein the second actuator is a pneumatic actuator operated in a passive mode.

4. The assembly tool of claim 1, further comprising a controller coupled to the encoder, the controller configured to compare the displacement distance with a predetermined tolerance range and to generate a calibration signal based on the comparison.

5. The assembly tool of claim 4, wherein the controller is configured to generate the calibration signal if the displacement distance is not within the predetermined tolerance range.

6. The assembly tool of claim 1, wherein the gripper assembly comprises:
    a gripper head configured to grip a first hard drive component;
    a gripper bracket configured to couple the gripper head to the second actuator; and
    an extension bracket configured to couple the gripper bracket to the encoder.

7. The assembly tool of claim 6, wherein the encoder comprises:

a scale coupled to one of the extension bracket and the gripper mount; and a reader coupled to the other of the extension bracket and the gripper mount, wherein the encoder is configured to indicate the displacement distance by measuring a position of the reader relative to the scale when the gripper assembly is displaced relative to the gripper mount.

8. The assembly tool of claim 1, wherein the gripper assembly is configured to grip a first hard drive component for picking the first hard drive component from a first nest and for placing the first hard drive component onto a second hard drive component on a second nest.

9. The assembly tool of claim 8, wherein the first hard drive component is a hard drive component gauge and the second hard drive component is a hard drive nest gauge.

10. The assembly tool of claim 9, further comprising the hard drive component gauge and the hard drive nest gauge.

11. The assembly tool of claim 9, wherein the second position is a pick position where the gripper assembly grips the hard drive component gauge on the first nest.

12. The assembly tool of claim 9, wherein the second position is a place position where the gripper assembly places the hard drive component gauge on the hard drive nest gauge on the second nest.

13. The assembly tool of claim 9, wherein the hard drive component gauge is configured to simulate a top voice coil magnet, and the hard drive nest gauge is configured to simulate a disk drive assembly.

14. The assembly tool of claim 13, wherein the hard drive component gauge comprises a gripping surface having a tolerance control that is 50% less than a tolerance control of a gripping surface of the top voice coil magnet, and wherein the hard drive nest gauge comprises a placement area having a tolerance control that is 50% less than a tolerance control of a placement area of the disk drive assembly.

15. A method for verifying the calibration of an assembly tool, the method comprising:
 sliding, with a first actuator, a gripper mount slidably mounted to a body of an assembly tool from a first position to a second position along an axis, wherein a gripper assembly is slidably mounted to the gripper mount with a second actuator, and wherein the second actuator is configured to facilitate displacement of the gripper assembly with respect to the gripper mount along the axis;
 measuring, with an encoder, a displacement distance between an expected position and an actual position of the gripper assembly with respect to the gripper mount along the axis when the gripper mount is in the second position;
 comparing the displacement distance with a predetermined tolerance range; and
 generating a calibration signal based on the comparison.

16. The method of claim 15,
wherein the encoder comprises:
 a scale coupled to one of the gripper assembly and one of the gripper mount; and
 a reader coupled to the other of the gripper assembly and the gripper mount, and
 wherein measuring the displacement distance comprises measuring a position of the reader relative to the scale when the gripper assembly is displaced relative to the gripper mount.

17. The method of claim 15, further comprising;
picking, with the gripper assembly, a first hard drive component from a first nest; and
placing, with the gripper assembly, the first hard drive component onto a second hard drive component on a second nest.

18. The method of claim 17, wherein the first hard drive component is a hard drive component gauge and the second hard drive component is a hard drive nest gauge.

19. The method of claim 18, wherein the second position is a pick position where the gripper assembly grips the hard drive component gauge on the first nest.

20. The method of claim 18, wherein the second position is a place position where the gripper assembly places the hard drive component gauge on the hard drive nest gauge on the second nest.

21. A controller for an assembly tool system, the controller comprising:
 a memory module containing executable instructions; and
 a processor configured to execute the instructions to perform a method for:
  sliding, with a first actuator, a gripper mount slidably mounted to a body of an assembly tool from a first position to a second position along an axis, wherein a gripper assembly is slidably mounted to the gripper mount with a second actuator, and wherein the second actuator is configured to facilitate displacement of the gripper assembly with respect to the gripper mount along the axis;
  measuring, with an encoder, a displacement distance between an expected position and an actual position of the gripper assembly with respect to the gripper mount along the axis when the gripper mount is in the second position;
  comparing the displacement distance with a predetermined tolerance range; and
  generating a calibration signal based on the comparison.

22. A machine-readable medium encoded with executable instructions for verifying the calibration of an assembly tool, wherein when the instructions are executed by a controller, the instructions cause the controller to:
 control a first actuator to slide a gripper mount slidably mounted to a body of an assembly tool from a first position to a second position along an axis, wherein a gripper assembly is slidably mounted to the gripper mount with a second actuator, and wherein the second actuator is configured to facilitate displacement of the gripper assembly with respect to the gripper mount along the axis;
 measure with an encoder, a displacement distance between an expected position and an actual position of the gripper assembly with respect to the gripper mount along the axis when the gripper mount is in the second position;
 compare the displacement distance with a predetermined tolerance range; and
 generate a calibration signal based on the comparison.

* * * * *